(12) United States Patent
Cao

(10) Patent No.: US 11,950,443 B2
(45) Date of Patent: Apr. 2, 2024

(54) OLED DISPLAY DEVICE

(71) Applicant: Wuhan China Star Optoelectronics Semiconductor Display Technology Co., Ltd., Wuhan (CN)

(72) Inventor: Huan Cao, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 952 days.

(21) Appl. No.: 16/957,754

(22) PCT Filed: Apr. 9, 2020

(86) PCT No.: PCT/CN2020/084025
§ 371 (c)(1),
(2) Date: Jun. 25, 2020

(87) PCT Pub. No.: WO2021/189538
PCT Pub. Date: Sep. 30, 2021

(65) Prior Publication Data
US 2023/0097889 A1 Mar. 30, 2023

(30) Foreign Application Priority Data
Mar. 25, 2020 (CN) .......................... 202010217677.6

(51) Int. Cl.
H10K 50/84 (2023.01)
H10K 59/12 (2023.01)
H10K 77/10 (2023.01)
H10K 102/00 (2023.01)

(52) U.S. Cl.
CPC ............. *H10K 50/84* (2023.02); *H10K 59/12* (2023.02); *H10K 77/111* (2023.02); *H10K 2102/311* (2023.02)

(58) Field of Classification Search
CPC ...... H10K 50/84; H10K 59/12; H10K 77/111; H10K 2102/311; H10K 59/40; G06F 1/1652; G09F 9/335; G09F 9/301
See application file for complete search history.

(56) References Cited

U.S. PATENT DOCUMENTS 10,727,435 B2 * 7/2020 Kim ..................... H05K 5/0017

FOREIGN PATENT DOCUMENTS

| CN | 208596323 | 3/2019 |
|---|---|---|
| CN | 208806014 | 4/2019 |
| CN | 109859634 | 6/2019 |
| CN | 209861329 | 12/2019 |
| CN | 110868485 | 3/2020 |
| WO | WO 2017/007060 | 1/2017 |

* cited by examiner

Primary Examiner — Michael C Zarroli
(74) Attorney, Agent, or Firm — PV IP PC; Wei Te Chung; Zhigang Ma

(57) ABSTRACT

An OLED display device includes a display panel, a metal sheet, and a middle frame. The display panel is closely attached to one side of the metal sheet, and is defined with a foldable area and a non-foldable area. The metal sheet is disposed between the middle frame and the display panel. The middle frame is disposed on one side of the metal sheet facing away from the display panel. The foldable area of the middle frame is disposed with a hub piece, and the foldable area of the metal sheet is disposed with a magnet sheet, and the magnet sheet is disposed opposite to the hub piece.

18 Claims, 3 Drawing Sheets

OLED DISPLAY DEVICE

RELATED APPLICATIONS

This application is a National Phase of PCT Patent Application No. PCT/CN2020/084025 having International filing date of Apr. 9, 2020, which claims the benefit of priority of Chinese Patent Application No. 202010217677.6 filed on Mar. 25, 2020. The contents of the above applications are all incorporated by reference as if fully set forth herein in their entirety.

FIELD AND BACKGROUND OF THE INVENTION

The present invention relates to a display technology, and more particularly to an OLED display device.

Researches and applications of flexible and foldable display screens have attracted more and more attention.

For foldable terminals, a display screen of the flexible display screen is fixed to a middle frame by an adhesive, and a foldable area of the display screen needs to be moved. Generally, no adhesive is used in the above area, that is, there is free vacuum between the display screen and the foldable area. Therefore, during a folding and unfolding process, adhesion stability between the above area of the display screen and the middle frame is low, causing problems such as easy detachment, floating, and bubbles that affect an appearance and easily lead to foreign matter intrusion, thereby affecting display quality.

Therefore, in existing flexible and foldable display technology, the low adhesion stability existing in the foldable area between the display screen and the middle frame of the flexible and foldable display screens results in problems affecting the display quality, such as easy detachment, floating, and bubbles that affect the appearance and easily lead to foreign matter intrusion, and needs urgent improvement.

SUMMARY OF THE INVENTION

The present application relates to an OLED display device, which is used to solve the existing problems in the prior art that the low adhesion stability existing in the foldable area between the display screen and the middle frame of the flexible and foldable display screens results in problems affecting the display quality, such as easy detachment, floating, and bubbles that affect the appearance and easily lead to foreign matter intrusion.

To solve the above problems, the present application provides the following technical solutions.

The present application provides an OLED display device, comprising:

a display panel, a metal sheet, and a middle frame, wherein:

the display panel is closely attached to one side of the metal sheet, and is defined with a foldable area and a non-foldable area;

the metal sheet is disposed between the middle frame and the display panel;

the middle frame is disposed on one side of the metal sheet facing away from the display panel; and the foldable area of the middle frame is disposed with a hub piece, and the foldable area of the metal sheet is disposed with a magnet sheet, and the magnet sheet is disposed opposite to the hub piece, and the middle frame and the metal sheet are rectangular.

According to an embodiment of the present application, the magnet sheet is attached to one side of the metal sheet close to the middle frame.

According to an embodiment of the present application, the magnet sheet is arranged in a plurality of regions on the metal sheet, and each region is arranged in an interval of dots.

According to an embodiment of the present application, a width of the magnet piece in each region is equal to a width of the hub piece, or a length of the magnet piece in each region is equal to a length of the hub piece.

According to an embodiment of the present application, a shape of the magnet sheet is circular, elliptical, or polygonal.

According to an embodiment of the present application, a length and a width of the metal sheet are equal to a length and a width of the middle frame, and the metal sheet has a predetermined thickness.

According to an embodiment of the present application, the predetermined thickness of the metal sheet is 0.1-0.3 mm.

According to an embodiment of the present application, the hub piece is a bendable hinge, the foldable region of the middle frame is disposed with a groove, the hub piece is disposed in the groove of the middle frame, and the groove is aligned with the magnet sheet on the metal sheet.

According to an embodiment of the present application, the material of the hub piece a magnetic metal.

According to an embodiment of the present application, a thickness of the hub piece is less than or equal to a thickness of the middle frame, and a width of the hub piece is equal to a width of the groove.

The present application further provides an OLED display device, comprising:

a display panel, a metal sheet, and a middle frame, wherein:

the display panel is closely attached to one side of the metal sheet, and is defined with a foldable area and a non-foldable area;

the metal sheet is disposed between the middle frame and the display panel;

the middle frame is disposed on one side of the metal sheet facing away from the display panel; and the foldable area of the middle frame is disposed with a hub piece, and the foldable area of the metal sheet is disposed with a magnet sheet, and the magnet sheet is disposed opposite to the hub piece.

According to an embodiment of the present application, the magnet sheet is attached to one side of the metal sheet close to the middle frame.

According to an embodiment of the present application, the magnet sheet is arranged in a plurality of regions on the metal sheet, and each region is arranged in an interval of dots.

According to an embodiment of the present application, a width of the magnet piece in each region is equal to a width of the hub piece, or a length of the magnet piece in each region is equal to a length of the hub piece.

According to an embodiment of the present application, a shape of the magnet sheet is circular, elliptical, or polygonal.

According to an embodiment of the present application, a length and a width of the metal sheet are equal to a length and a width of the middle frame, and the metal sheet has a predetermined thickness.

According to an embodiment of the present application, the predetermined thickness of the metal sheet is 0.1-0.3 mm.

According to an embodiment of the present application, the hub piece is a bendable hinge, the foldable region of the middle frame is disposed with a groove, the hub piece is disposed in the groove of the middle frame, and the groove is aligned with the magnet sheet on the metal sheet.

According to an embodiment of the present application, a material of the hub piece a magnetic metal.

According to an embodiment of the present application, a thickness of the hub piece is less than or equal to a thickness of the middle frame, and a width of the hub piece is equal to a width of the groove.

Compared with the prior art, the beneficial effects of an OLED display device provided by the present application are:

An OLED display device provided by the present application, wherein the OLED display device comprises a display panel, a metal sheet, and a middle frame. The display panel is closely attached to one side of the metal sheet, and is defined with a foldable area and a non-foldable area. The metal sheet is disposed between the middle frame and the display panel. The middle frame is disposed on one side of the metal sheet facing away from the display panel. The foldable area of the middle frame is disposed with a hub piece, and the foldable area of the metal sheet is disposed with a magnet sheet, and the magnet sheet is disposed opposite to the hub piece. Therefore, the adhesion stability of the middle frame and the display panel can be improved, and the display panel and the middle frame will not easily fall off when the OLED display device is folded.

BRIEF DESCRIPTION OF THE SEVERAL VIEWS OF THE DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DESCRIPTION OF SPECIFIC EMBODIMENTS OF THE INVENTION

Figure 1:
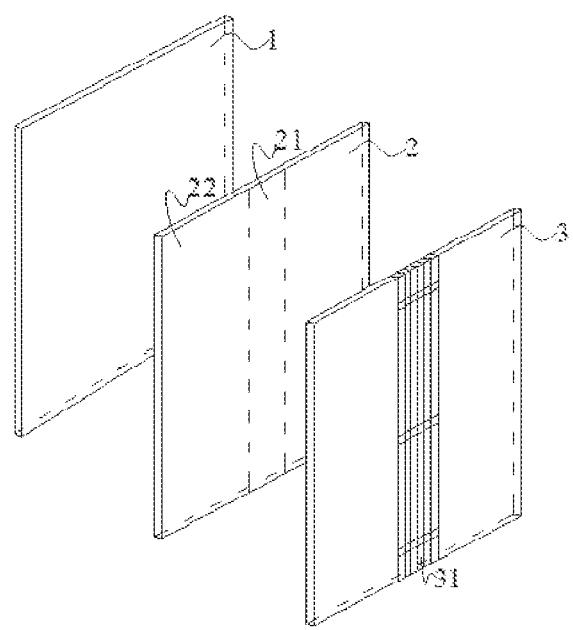
FIG. 1 is a first schematic structural diagram of an OLED display device provided by an embodiment of the present application.

The technical solutions in the embodiments of the present application will be described clearly and completely with reference to the drawings in the embodiments of the present application. Obviously, the described embodiments are only a part of the embodiments of the present application, but not all the embodiments. Based on the embodiments in the present application, all other embodiments obtained by those skilled in the art without making creative work fall within the protection scope of the present application.

The following description is based on the specific embodiments of the present invention as illustrated and should not be construed as limiting the specific embodiments that are not described herein. The directional terms mentioned in the present invention, such as "upper", "lower", "before", "after", "left", "right", "inside", "outside", "side", etc., are only used to show direction in the figures. The directional terms used in the drawings are used to explain and explain the invention and are not intended to limit the scope of the invention. In addition, the terms "first" and "second" are used for description purposes only, and cannot be understood as indicating or implying relative importance or implicitly indicating the number of technical features indicated. Thus, the features defined as "first" and "second" may explicitly or implicitly include one or more of the features. In the description of this application, the meaning of "a plurality of" is two or more, unless otherwise specifically limited.

In the description of this application, it should be noted that, unless otherwise clearly specified and limited, the terms "installation", "connected", and "connection" should be understood in a broad sense, for example, it can be fixed or detachable; connected, or integrally connected; it can be mechanical, electrical, or can communicate with each other; it can be directly connected, or it can be indirectly connected through an intermediary, it can be the connection between two elements or the interaction of two elements relationship. Those of ordinary skill in the art can understand the specific meanings of the above terms in this application according to specific situations.

In this application, unless otherwise clearly specified and defined, the first feature "above" or "below" the second feature may include the direct contact of the first and second features, or may include the first and second features contact not directly but through other features between them. Moreover, the first feature is "over", "above" and "on" the second feature includes that the first feature is directly above and obliquely above the second feature, or simply means that the first feature is higher in level than the second feature. The first feature is "under", "below" and "underlying" the second feature includes that the first feature is directly below and obliquely below the second feature, or simply means that the first feature is less horizontal than the second feature.

The following disclosure provides many different embodiments or examples for implementing different structures of the present application. In order to simplify the disclosure of the present application, the components and settings of specific examples are described below. Of course, they are only examples, and the purpose is not to limit this application. In addition, the present application may repeat reference numerals and/or reference letters in different examples. Such repetition is for simplicity and clarity, and does not itself indicate the relationship between the various embodiments and/or settings discussed. In addition, the present application provides examples of various specific processes and materials, but those of ordinary skill in the art may be aware of the application of other processes and/or the use of other materials.

The present application provides an OLED display device, please refer to FIGS. 1-5 for further details.

In existing flexible and foldable display technology, low adhesion stability existing in a foldable area between a display screen and a middle frame of flexible and foldable display screens results in problems affecting display quality, such as easy detachment, floating, and bubbles that affect an appearance and easily lead to foreign matter intrusion, and needs urgent improvement.

In existing foldable terminals, a display screen of a flexible display screen is fixed to the middle frame by an adhesive, and a foldable area of the display screen needs to be moved. Generally, no adhesive is used in the above area, that is, there is free vacuum between the display screen and the foldable area. Therefore, during a folding and unfolding process, adhesion stability between the above area of the display screen and the middle frame is low, causing problems such as easy detachment, floating, and bubbles that affect an appearance and easily lead to foreign matter intrusion, thereby affecting display quality. Accordingly, the present application provides an OLED display device to solve the above problems Refer to FIG. 1, a first schematic structural diagram of an OLED display device provided by an embodiment of the present application is provided. The OLED display device comprises a display panel 1, a metal sheet 2, and a middle frame 3. The display panel 1 is closely attached to one side of the metal sheet 2, and is defined with a foldable area 21 and a non-foldable area 22. The metal sheet 2 is disposed between the middle frame 3 and the display panel 1. The middle frame 3 is disposed on one side of the metal sheet 2 facing away from the display panel 1. A foldable area 31 of the middle frame 3 is disposed with a hub piece, and the foldable area 21 of the metal sheet 2 is disposed with a magnet sheet 24, and the magnet sheet 24 is disposed opposite to the hub piece.

Furthermore, the middle frame 3 and the metal sheet 2 are rectangular, and both have a shape that is same as the display panel 1. The magnet sheet 24 is attached to one side of the metal sheet 2 close to the middle frame 3, and each region therein is arranged in an interval of dots, i.e. in an equidistant array or an unequal array. A shape of the magnet sheet 24 can be circular, elliptical, polygonal, etc.

Furthermore, the foldable region 31 of the middle frame 3 is defined with a groove, and the hub piece is disposed in the groove. The hub piece is a bendable hinge, and the groove is aligned with the magnet sheet on the metal sheet, which can rotate at a certain angle, and the rotation angle is greater than or equal to 180 degrees. During installation, the magnet sheet 24 on the metal sheet 2 is installed in alignment with the metal sheet 2 through the groove on the middle frame 3.

Figure 2:
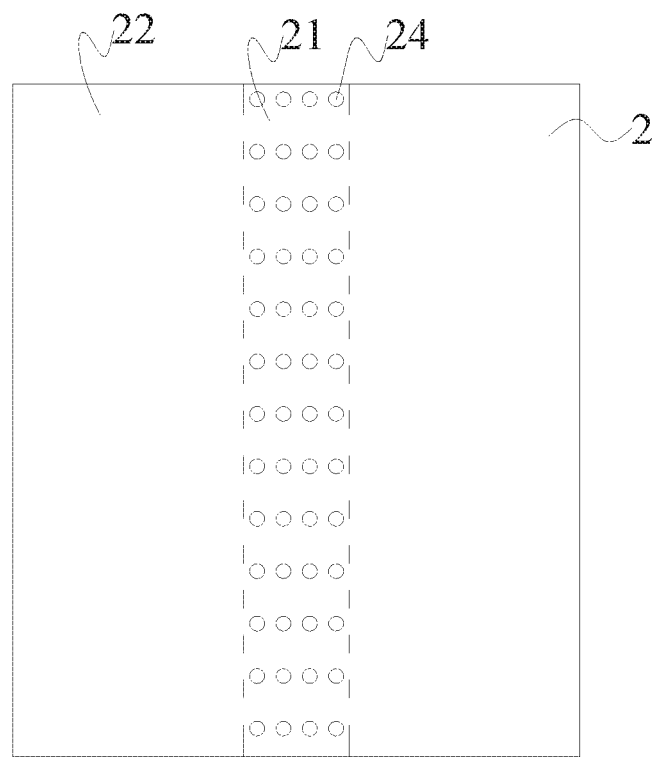
FIG. 2 is a first schematic structural diagram of a metal sheet provided by an embodiment of the present application.
Figure 3:
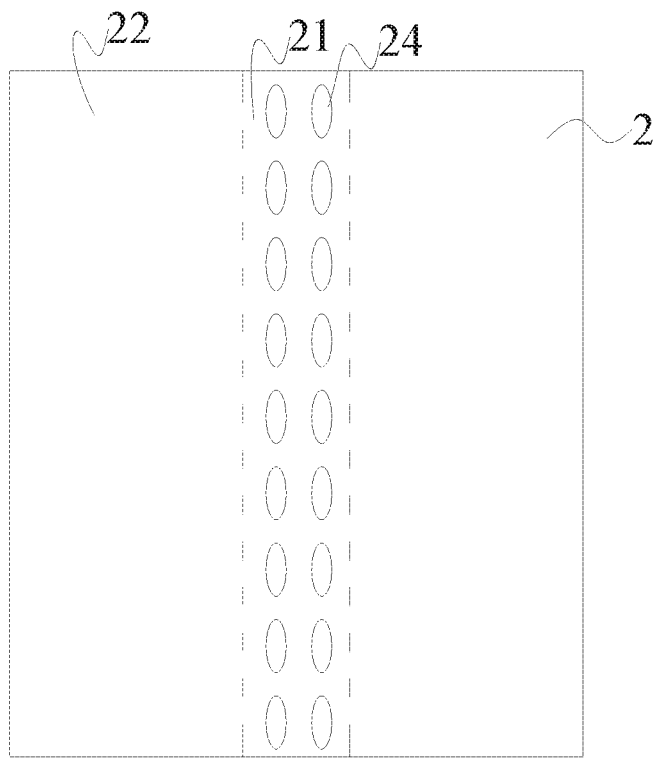
FIG. 3 is a second schematic structural diagram of a metal sheet provided by an embodiment of the present application.
Figure 4:
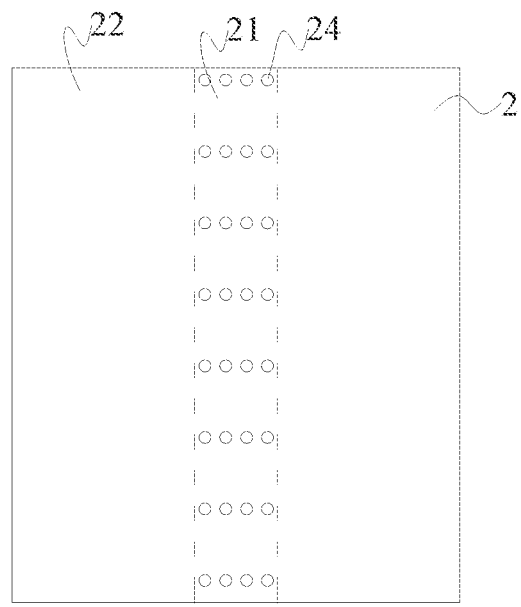
FIG. 4 is a third schematic structural diagram of the metal sheet provided by an embodiment of the present application.
Figure 5:
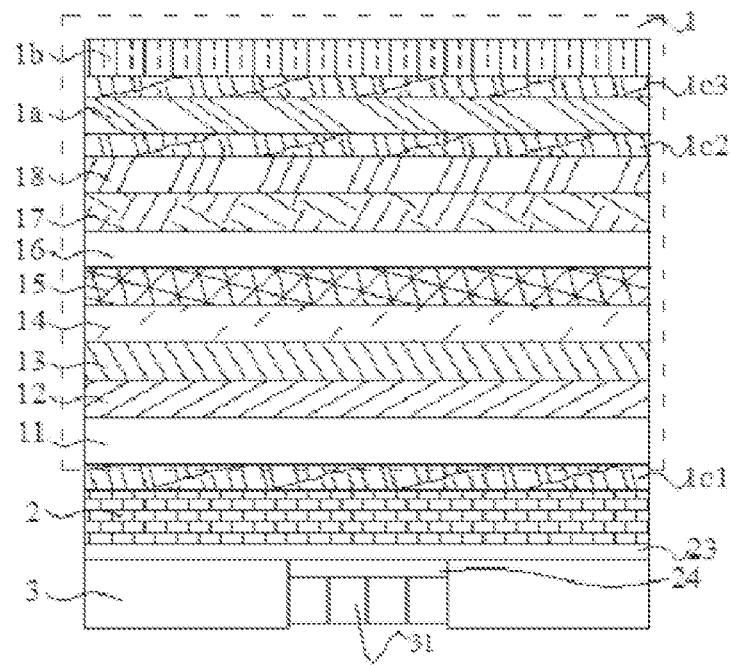
FIG. 5 is a second schematic structural diagram of the OLED display device provided by an embodiment of the present application.

In some embodiments of the present application, a width of the magnet sheets 24 in each area is equal to the width of the hub sheets, that is, the magnet sheets 24 in each area are arranged laterally and spaced apart, see FIG. 2 and FIG. 3 for further details. In other embodiments of the present application, the length of the magnet sheets 24 in each area is equal to the length of the hub piece, that is, the magnet sheets 24 in each area are arranged at intervals in the longitudinal direction, see FIG. 4 for further details. The number of areas of the magnet sheet 24 is greater than or equal to 2.

Further, the length and width of the metal sheet 2 are equal to the length and width of the middle frame 3. The metal sheet 2 has a predetermined thickness, and the predetermined thickness of the metal sheet 2 is, for example, 0.1-0.3 mm. The material of the hub piece can be a magnetic metal such as various black metals with good electrical conductivity, thermal conductivity, and mechanical properties, which are, for example, iron alloy, iron, cobalt, and nickel. The metal sheet may comprise stretch-resistant stainless steel.

Further, the thickness of the hub piece is less than or equal to the thickness of the middle frame 3, and the width of the hub piece is equal to the width of the groove. The middle frame 3 and the metal sheet 2 are glued with industrial AB glue with strong stickiness. The AB glue is called a two-component adhesive, which uses one liquid as a glue and another liquid as a hardener, and these two liquids can be hardened by mixing. It does not need to be hardened and matured by temperature, so it is a type of room temperature hardening glue, which is sometimes used for modeling. The component A is acrylic modified epoxy or epoxy resin, or contains catalyst and other additives, and the component B is modified amine or other hardener, or contains catalyst and other additives. By mixing thereof in a certain ratio, the catalyst can control the curing time, and other additives can control the performance (such as viscosity, steel, flexibility, adhesion, etc.).

Further, the metal sheet 2 and the display panel 1 are adhered by an optically transparent adhesive (optically clear adhesive, OCA) 1c, and the optically transparent adhesive 1c has high light transmittance (with a total light transmittance greater than 99%), high adhesion, high weather resistance, water resistance, high temperature resistance, UV resistance, and a controlled thickness, thereby providing uniform spacing and not causing problems such as yellowing under long-term use, peeling, and deterioration.

When the OLED display device is bending, the foldable area 31 (i.e. the hub piece) of the middle frame 3 changes accordingly with the bending angle and direction. Since the foldable area 31 is provided with a hinge, when the OLED display device is bent, the width of the hub piece is greater than the width of the hub piece before bending. Therefore, when the metal sheet 2 is bent, the magnet sheets 24 which are spaced dot-shaped magnet pieces 24 can be closer to the hub piece of the middle frame 3, so that the adhesion stability will be higher no matter what angle the metal sheet 2 and the middle frame 3 are folded. The magnet sheets 24 and the hub piece can be perfectly fit.

Furthermore, the display panel comprises:

A substrate 11 used for depositing various film layers, which may be a rigid substrate such as a glass substrate or a quartz substrate. The substrate 11 may also be a flexible substrate, preferably a flexible substrate, such as a resin substrate, or it may be organic substrates such as polyimide substrate, polyamide substrate, polycarbonate substrate, polyethersulfone substrate, etc.

A thin film transistor layer 12 disposed on the side of the substrate 11 and is manufactured by chemical vapor deposition methods. The thin film transistor layer 12 comprises a gate layer and a source-drain layer. The thin film transistor may be a top-gate type thin-film transistor or a bottom-gate thin-film transistor.

An OLED device layer 13 disposed on a side of the thin film transistor layer 12 facing away from the base substrate 11. The OLED device layer 13 comprises a cathode layer, a light emitting layer, an electron injection layer, an electron transport layer, a hole injection layer, a hole transport layer, and a barrier layer. Among them, the material of the cathode layer is a material with a low work-function, which can improve the efficiency of electron injection, reduce Joule heat generated during the operation of the OLED, and improve lifespan of the device. In the embodiment of the present application, the anode layer is not disposed in the OLED device layer, but on the side of a planarization layer facing away from the OLED device layer. The luminescence principle of the OLED device layer is that a voltage is applied to the anode layer and the cathode layer through a circuit connecting the anode layer and the cathode layer, so that holes are injected by the anode layer and electrons are injected by the cathode layer. The formed electrons and holes encounter in the luminescent material layer to generate excitons, thereby exciting the luminescent material layer to emit light.

A planarization layer 14 disposed on one side of the OLED device layer 13 facing away from the thin film transistor 12, for planarizing a surface of the OLED device layer 13.

A pixel definition layer 15 disposed on one side of the planarization layer 14 facing away from the OLED device layer 13, and a half-tone mask is generally used to define the pattern of the pixel definition layer. That is, a photoresist layer is coated on the pixel definition layer 15, a half-tone mask is placed above the pixel definition layer, and then the photoresist layer on the surface of the pixel definition layer 15 through the halftone mask is exposed and developed through a photography process. Then, the photoresist layer is used to expose and develop as a barrier layer to etch the pixel definition layer 15. The exposure of the photography process affects the thickness of the pixel definition layer 15.

Anode layers 16 spaced apart on the side of the planarization layer 14 facing away from the OLED device layer 13, and the plurality of anode layers 16 between the pixel-defining layers 15 are mainly used for light reflection. A via hole is formed in the planarization layer 14 to electrically communicate with the OLED device layer 13 to complete light emission. The anode layers 16 need to have a higher work-function because they need to inject holes into the OLED. Therefore, the material generally used for the anode layers 16 can be ITO, IZO, Au, Pt, Si, etc.

A light-emitting layer 17 is divided into: a red light-emitting layer 171, a green light-emitting layer 172, and a blue light-emitting layer 173; or a red light-emitting layer 171, a green light-emitting layer 172, a blue light-emitting layer 173, and a white light-emitting layer 174 (not shown in the figure), which are respectively disposed between the pixel definition layers 15 and one side of each anode layer 16 facing away the planarization layer 14. The light-emitting layer 17 is generally manufactured by inkjet printing.

A thin-film encapsulation layer 18 which is further divided into a first inorganic encapsulation layer, an organic encapsulation layer, and a second inorganic encapsulation layer, which are sequentially stacked on one side of the pixel definition layer 15 facing away from the planarization layer 14 for protecting the internal film layers of the display panel from intrusion of external moisture and impurities which affects the display quality of the display panel.

A polarizing sheet 19, wherein in an embodiment of the present application, a polarizing dye molecular layer is evenly distributed in the polarizing sheet, and the polarizing dye molecular layer can be an iodine molecular layer. When actually manufacturing the polarizing sheet, an organic dye (such as iodine) can be used to dye the polyvinyl alcohol (PVA) film in sections and then the dyed PVA film is stretched according to a predetermined direction under an environment with certain temperature and humidity, and a second polarizing layer with alternating light-transmitting areas and opaque areas can be formed finally after dehydration, drying and other processes, wherein the undyed area on the PVA film is a light transmitting area, the dyed area is the polarizing area, and the predetermined direction for stretching the PVA film is a absorption axis direction of the polarized area.

A touch function layer 1a which is disposed between the polarizing sheet 19 and the cover plate 1b.

And a cover plate 1b, which covers the side of the touch function layer 1a facing away from the polarizing sheet 19, and the cover plate 1b is a glass cover plate.

Furthermore, adhesion between the metal sheet 2 and the display panel 1, between the display panel 1 and the polarizing sheet 19, between the polarizing sheet 19 and the touch function layer 1a, and between the touch function layer 1a and the cover plate 1b are formed by adhesion of the optically transparent adhesive (1c1, 1c2, 1c3).

The OLED display device provided by the embodiments of the present application has been described in detail above, and specific examples have been used to explain the principles and implementations of the present application. The descriptions of the above embodiments are only used to help understand the technology of the present application, solutions and their core ideas; those of ordinary skill in the art should understand that they can still modify the technical solutions described in the foregoing embodiments or equivalently replace some of the technical features; and these modifications or replacements do not make the essence of the corresponding technical solutions deviate from the scope of the technical solutions of the embodiments of the present application.

What is claimed is:

1. An OLED display device, comprising:
a display panel, a metal sheet, and a middle frame, wherein:
the display panel is closely attached to one side of the metal sheet, and is defined with a foldable area and a non-foldable area;
the metal sheet is disposed between the middle frame and the display panel;
the middle frame is disposed on one side of the metal sheet facing away from the display panel; and
the foldable area of the middle frame is disposed with a hub piece, the foldable area of the metal sheet is disposed with a magnet sheet, the magnet sheet is disposed opposite to the hub piece and arranged in a plurality of regions on the metal sheet, each region is arranged in an interval of dots, and the middle frame and the metal sheet are rectangular.

2. The OLED display device according to claim 1, wherein the magnet sheet is attached to one side of the metal sheet close to the middle frame.

3. The OLED display device according to claim 1, wherein a width of the magnet sheet in each region is equal to a width of the hub piece; or
a length of the magnet sheet in each region is equal to a length of the hub piece.

4. The OLED display device according to claim 3, wherein a shape of the magnet sheet is circular, elliptical, or polygonal.

5. The OLED display device according to claim 1, wherein a length and a width of the metal sheet are equal to a length and a width of the middle frame, and the metal sheet has a predetermined thickness.

6. The OLED display device according to claim 5, wherein the predetermined thickness of the metal sheet is 0.1-0.3 mm.

7. The OLED display device according to claim 1, wherein the hub piece is a bendable hinge, the foldable region of the middle frame is disposed with a groove, the hub piece is disposed in the groove of the middle frame, and the groove is aligned with the magnet sheet on the metal sheet.

8. The OLED display device according to claim 7, wherein a material of the hub piece is a magnetic metal.

9. The OLED display device according to claim 7, wherein a thickness of the hub piece is less than or equal to a thickness of the middle frame, and a width of the hub piece is equal to a width of the groove.

10. An OLED display device, comprising:
a display panel, a metal sheet, and a middle frame, wherein:
the display panel is closely attached to one side of the metal sheet, and is defined with a foldable area and a non-foldable area;
the metal sheet is disposed between the middle frame and the display panel;
the middle frame is disposed on one side of the metal sheet facing away from the display panel; and
the foldable area of the middle frame is disposed with a hub piece, the foldable area of the metal sheet is disposed with a magnet sheet, and the magnet sheet is disposed opposite to the hub piece and arranged in a plurality of regions on the metal sheet, and each region is arranged in an interval of dots.

11. The OLED display device according to claim 10, wherein the magnet sheet is attached to one side of the metal sheet close to the middle frame.

12. The OLED display device according to claim 10, wherein a width of the magnet sheet in each region is equal to a width of the hub piece; or
a length of the magnet sheet in each region is equal to a length of the hub piece.

13. The OLED display device according to claim 12, wherein a shape of the magnet sheet is circular, elliptical, or polygonal.

14. The OLED display device according to claim 10, wherein a length and a width of the metal sheet are equal to a length and a width of the middle frame, and the metal sheet has a predetermined thickness.

15. The OLED display device according to claim 14, wherein the predetermined thickness of the metal sheet is 0.1-0.3 mm.

16. The OLED display device according to claim 10, wherein the hub piece is a bendable hinge, the foldable region of the middle frame is disposed with a groove, the hub piece is disposed in the groove of the middle frame, and the groove is aligned with the magnet sheet on the metal sheet.

17. The OLED display device according to claim 16, wherein a material of the hub piece is a magnetic metal.

18. The OLED display device according to claim 16, wherein a thickness of the hub piece is less than or equal to a thickness of the middle frame, and a width of the hub piece is equal to a width of the groove.

* * * * *